(12) United States Patent
Lin et al.

(10) Patent No.: US 7,021,368 B2
(45) Date of Patent: Apr. 4, 2006

(54) HEAT DISSIPATING DEVICE WITH UNIFORM HEAT POINTS

(75) Inventors: Kuo-Len Lin, Wugu Township, Taipei County (TW); Hui-Min Tsui, Wugu Township, Taipei County (TW)

(73) Assignee: Cpumate Inc., Taipei (TW)

( * ) Notice: Subject to any disclaimer, the term of this patent is extended or adjusted under 35 U.S.C. 154(b) by 194 days.

(21) Appl. No.: 10/704,571

(22) Filed: Nov. 12, 2003

(65) Prior Publication Data
US 2005/0098304 A1    May 12, 2005

(51) Int. Cl.
*H05K 7/20* (2006.01)
*F28D 15/00* (2006.01)

(52) U.S. Cl. .............................. 165/104.33; 165/80.3; 165/121; 361/697; 361/700

(58) Field of Classification Search .................... None
See application file for complete search history.

(56) References Cited

U.S. PATENT DOCUMENTS

| | | | |
|---|---|---|---|
| 6,542,364 B1 * | 4/2003 | Lai et al. ..................... | 361/697 |
| 6,625,021 B1 * | 9/2003 | Lofland et al. ............. | 361/697 |
| 6,651,734 B1 * | 11/2003 | Liu ........................... | 165/80.3 |
| 6,779,595 B1 * | 8/2004 | Chiang .................. | 165/104.33 |
| 6,796,373 B1 * | 9/2004 | Li ........................ | 165/104.21 |
| 6,909,608 B1 * | 6/2005 | Fan ............................ | 361/700 |
| 6,918,429 B1 * | 7/2005 | Lin et al. ................... | 165/80.3 |
| 2003/0141041 A1 * | 7/2003 | Chen ......................... | 165/80.3 |
| 2005/0073811 A1 * | 4/2005 | Wang et al. ................ | 361/688 |

\* cited by examiner

*Primary Examiner*—Allen J. Flanigan

(57) ABSTRACT

A heat dissipating device with uniform heat points, having a first heat sink, a second heat sink and at least two heat pipes. The second heat sink is aligned over the first heat sink. Each heat pipe has a heat absorbing portion and a heat dissipating portion. The heat absorbing and dissipating portions of each heat pipe are in thermal communication with the first and second heat sinks, respectively. The distance between two neighboring heat absorbing portions is smaller than the distance between the heat pipe and the heat sink. Thereby, the heat absorbing portions are concentrated to absorb heat generated by a heat source, and the heat dissipating portions are distributed over a larger area to effectively dissipate the heat.

15 Claims, 7 Drawing Sheets

HEAT DISSIPATING DEVICE WITH UNIFORM HEAT POINTS

BACKGROUND OF THE INVENTION

The present invention relates to a heat dissipating device with uniform heat points, and more particular, to a heat dissipating device of which the heat pipes are rearranged.

Heat pipes have been broadly applied to dissipate heat generated by electronic devices for having the characteristics of high thermal conductivity, light weight, simple structure and capability of transfer large amount of heat without consuming electricity.

To apply the heat pipes to heat dissipating devices of electronic products, one ends of the heat pipes are typically in thermal communication with the heat generating devices of the electronic products, while the other ends of the heat pipes include a plurality of fins. By the high thermal conductivity of the heat pipes, the heat generated by the heat generating devices are transferred to the fins instantly to reduce the temperature of the heat generating devices. Meanwhile, the heat accumulated in the fins can be dissipated by installation of a fan to achieve a good heat dissipation effect. In addition, to more efficiently dissipate heat generated by electronic products, more than one heat pipe might be used. However, in most heat dissipation devices, the heat pipes are arranged to extend vertically and parallel to each other. Therefore, if the distance between the neighboring heat pipes is too large, it is disadvantageous for the heat pipe to be in contact with the heat generating source. On the contrary, if the distance between the neighboring heat pipes is too small, the heat is too concentrated to be dissipated.

BRIEF SUMMARY OF THE INVENTION

The present invention provides a heat dissipating device with uniform heat points. By rearrange the positions of the heat pipes, heat points are distributed on the heat generating source. Therefore, the effective heat dissipation areas are increased to provide improved heat dissipation performance.

The heat dissipating device provided by the present invention comprises a first heat sink, a second heat sink aligned over the first heat sink, and at least two heat pipes. Each of the heat pipes includes a heat absorbing portion in thermal communication with the first heat sink and a heat dissipating portion in thermal communication with the second heat sink. The distance between the heat absorbing portions of the heat pipes is smaller than the distance between the heat generating portions of the heat pipes, such that the heat generated by a heat source can be effectively absorbed, and efficiently and uniformly dissipated by the heat dissipation portions distributed over a large area of the second heat sink.

BRIEF DESCRIPTION OF THE DRAWINGS

These, as well as other features of the present invention, will become apparent upon reference to the drawings wherein.

DETAILED DESCRIPTION OF THE INVENTION

Figure 1:
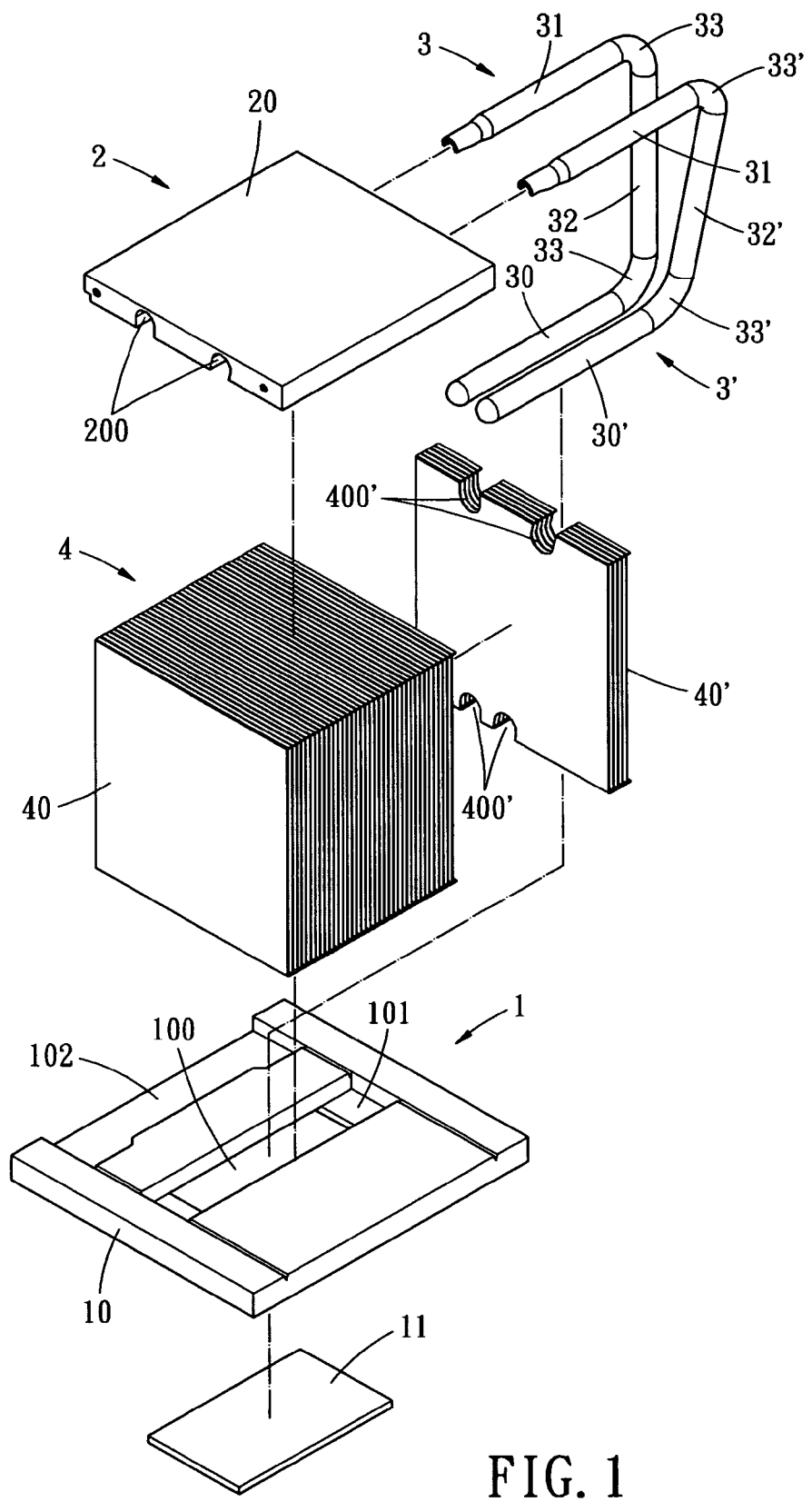
FIG. 1 shows an exploded view of a heat dissipating device with uniform heat points.
Figure 2:
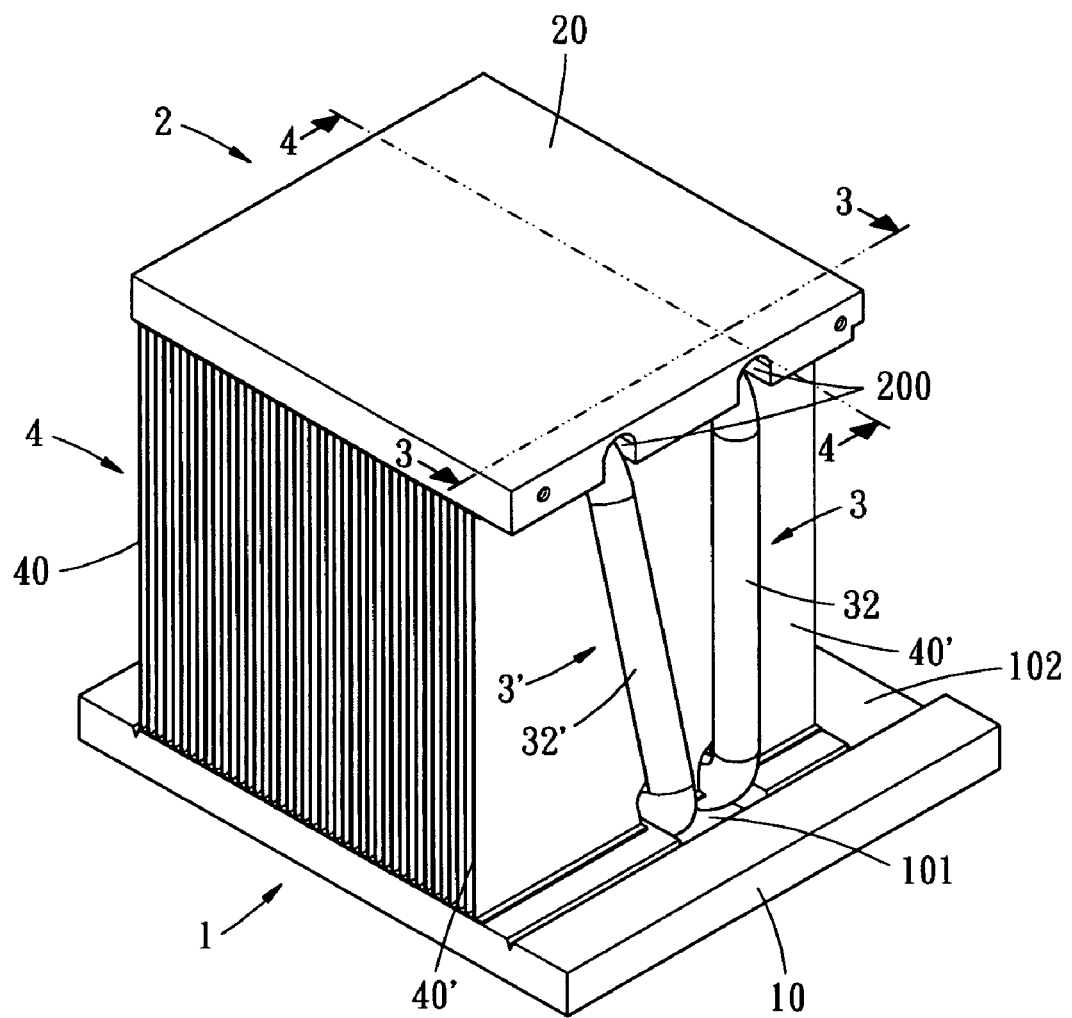
FIG. 2 shows a perspective view of the heat dissipating device.
Figure 3:
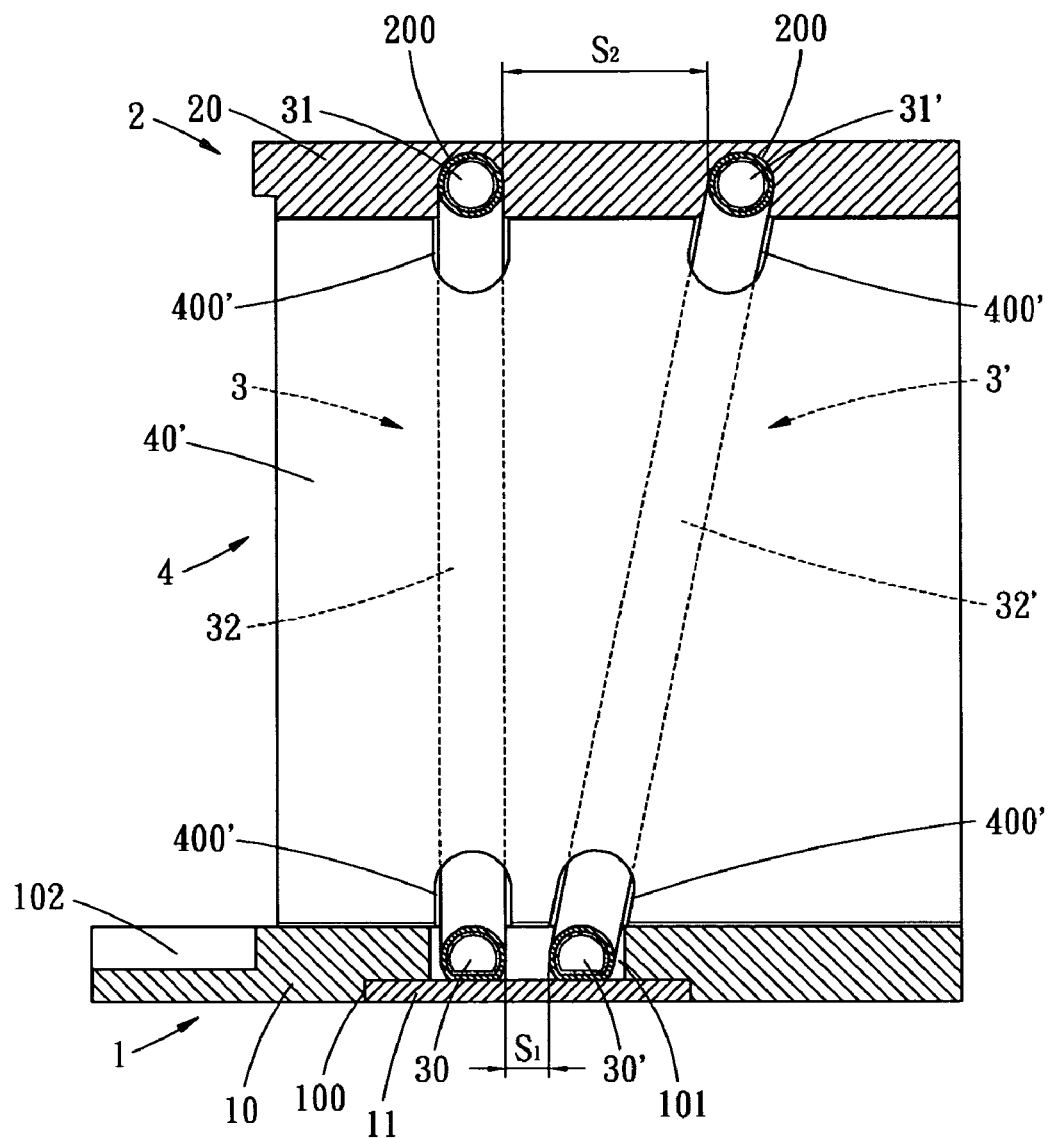
FIG. 3 shows a cross-sectional view along line 3—3 of FIG. 2.

FIGS. 1–3 depict an exploded view, a perspective view and a cross-sectional view of a heat dissipating device with uniform heat points. As shown, the heat dissipating device includes a first heat sink 1, a second heat sink 2 and at least two heat pipes 3 and 3'.

The heat sink 1 is fabricated from good thermal conductive material such as aluminum. In this embodiment, the heat sink 1 has a planar configuration. The heat sink includes a substrate 10. The bottom surface of the substrate 100 is recessed with a receiving slot 100 for embedding a thermal conductor 111 therein. The thermal conductor 11 has a thermal coefficient larger than that of the first heat sink 1. The thermal conductor 11 can be fabricated from copper, for example. The thermal conductor 11 has a planar configuration to be directly attaching to a heat generating device such as a central processing unit (CPU) or an electronic device. The top surface of the substrate 10 is opened with a slot 101 aligned over and in communication with the thermal conductor 11, such that the heat pipes 3 and 3' can be inserted in the slot 101 to be in direct contact with the thermal conductor 11.

The second heat sink 2 is disposed over the top surface of the first heat sink 1. The second heat sink 2 has a planar configuration and is fabricated from good thermal conductive material such as aluminum and copper. The second heat sink 2 also includes a substrate 20 with a bottom surface opened with at least two slots 200 for receiving the portions of the heat pipes 3 and 3'. The heat dissipating device further comprises a set of fins 4 disposed between the bottom surface of the second heat sink 2 and the top surface of the first heat sink 1. The set of fins 4 comprises a plurality of fins 40 and 40' alternatively stacked with each other laterally. Each of the fins 40 and 40' can be fabricated from copper, for example.

The heat pipes 3 and 3' include two U-shaped tubes each having a heat absorbing portion 30, 30', a heat dissipating portion 31, 31', and a heat conducting portion 32, 32' interconnecting the heat absorbing and dissipating portions 30, 31 and 30', 31', respectively. Bending portions 33, 33' can also be used to serve as intermediates between the heat conducting portions 32, 32' and the heat absorbing and dissipating portions 30, 30' and 31, 31', respectively. In this embodiment, the heat dissipating portions 31 and 31' of the heat pipes 3 and 3' are inserted into the slots 200 of the second heat sink 2, while the heat absorbing portions 30 and 30' are inserted into the slots 101 of the first heat sink 101 to be in direct contact with the thermal conductor 11 (as shown in FIG. 3). Therefore, the heat absorbed by the thermal conductor 11 can be instantly delivered to the heat dissipating portions 31 and 31' via the heat conducting portions 32 and 32', respectively.

In this embodiment, the heat pipe 3' is slanted from the vertical direction with an angle, such that the distance $S_1$ between the heat absorbing portions 30 and 30' is smaller than the distance $S_2$ between the heat dissipating portions 31 and 31'. Alternatively, the heat pipes 3 and 3' can also be radially disposed to result in the same condition, that is, the smaller distance between the heat absorbing portions 30 and 30' and the larger distance between the heat dissipating portions 31 and 31'. Thereby, the heat absorbing portions 30 and 30' are closely arranged with each other, such that the heat can be distributed to all the heat absorbing portions 30 and 30' easily. The heat absorbed by the heat absorbing portions 30 and 30' are then transferred to the heat dissipating portions 31 and 31' which are remote to each other, such that a larger area for dissipating heat is obtained.

Figure 4:
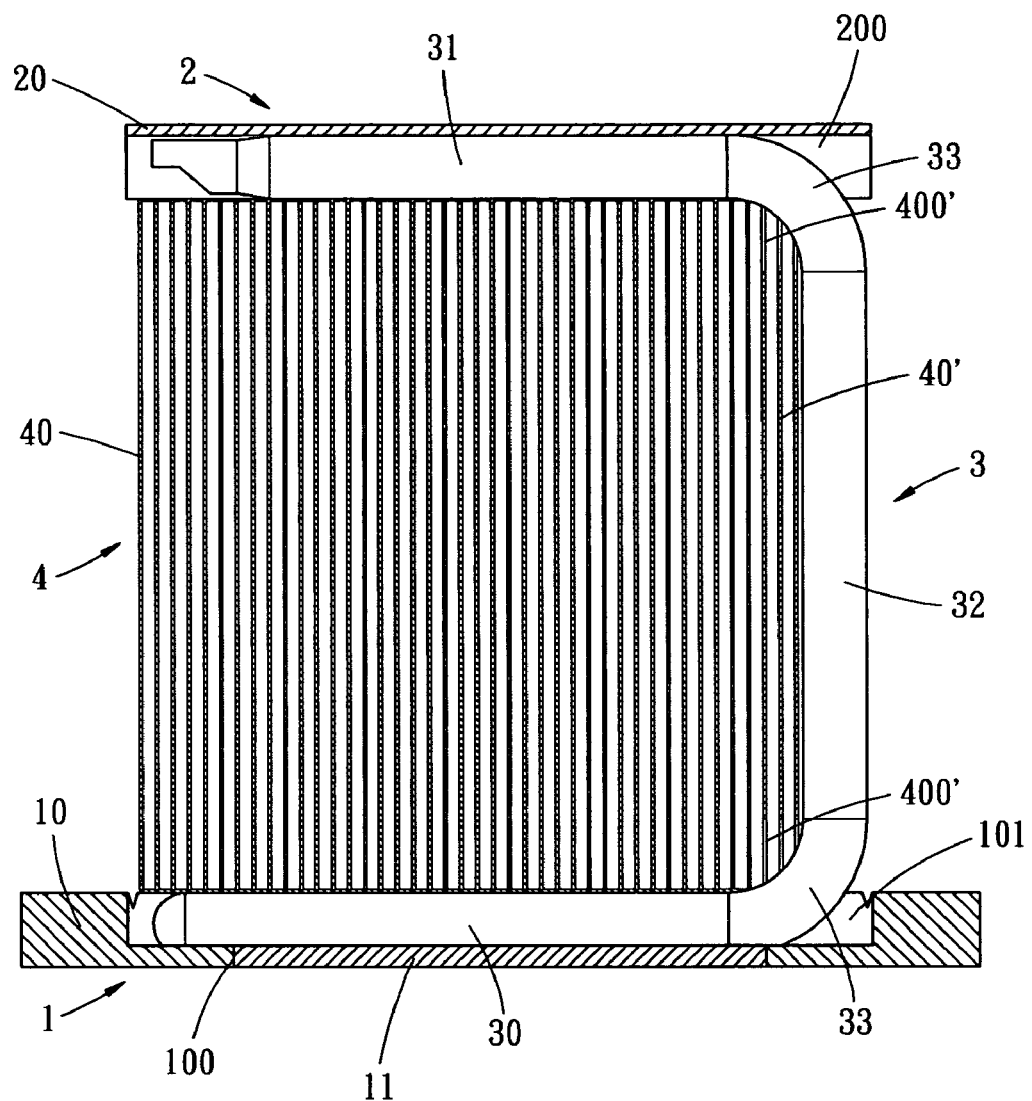
FIG. 4 shows a cross-sectional view along line 4—4 of FIG. 2.

Referring to FIGS. 1 and 4, each of the fins 40' close to the heat pipes 3 and 3' further comprises two pairs of notches or grooves 400' for receiving the bending portions 33 and 33' therein. Therefore, the heat conducting portions 32 and 32' can be arranged close to the fins 40' (as shown in FIG. 4) to avoid increasing the overall volume of the heat dissipating device.

Thereby, a heat dissipating device with uniform heat points is obtained.

Figure 5:
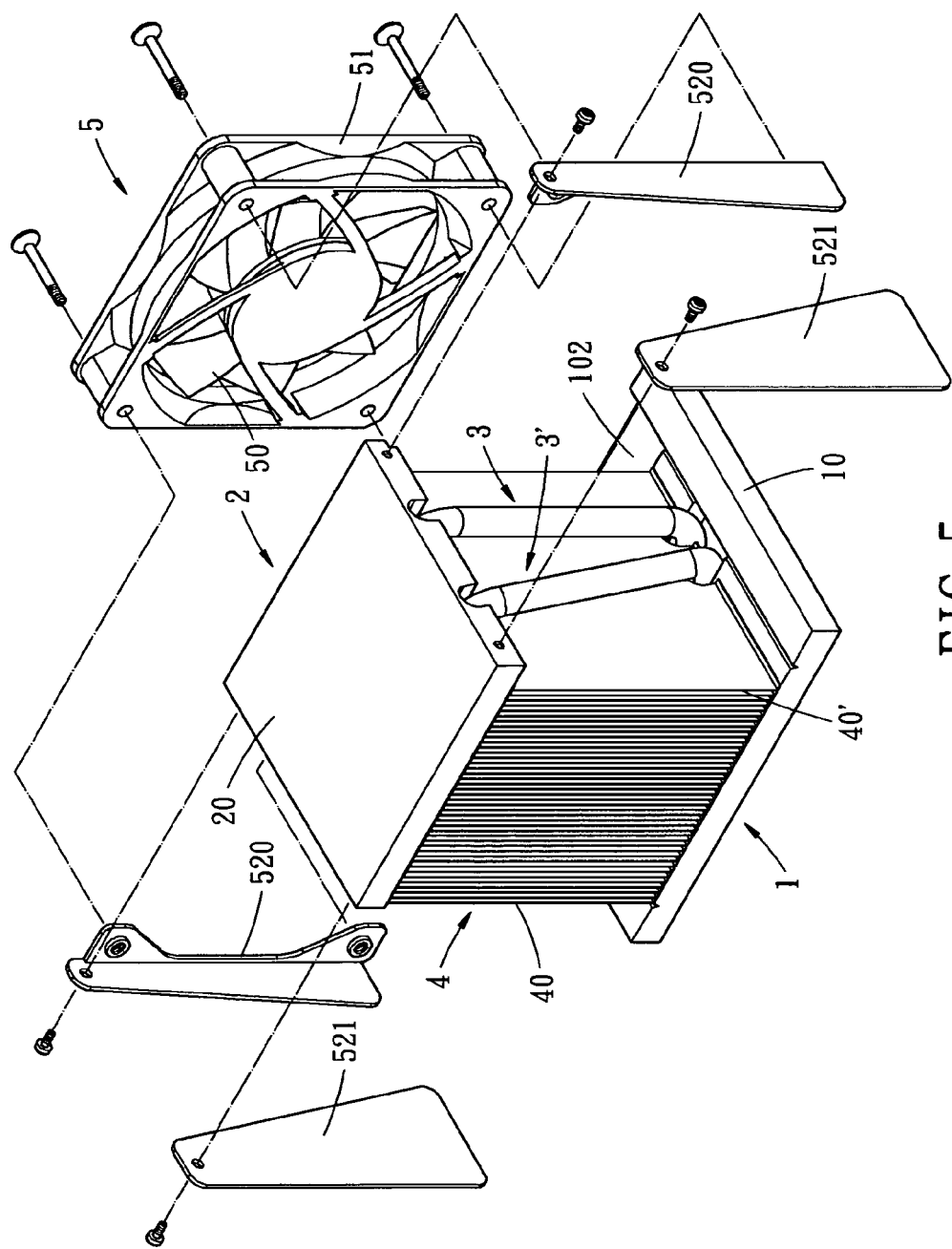
FIG. 5 shows an exploded view of a heat dissipating device incorporating a fan.
Figure 6:
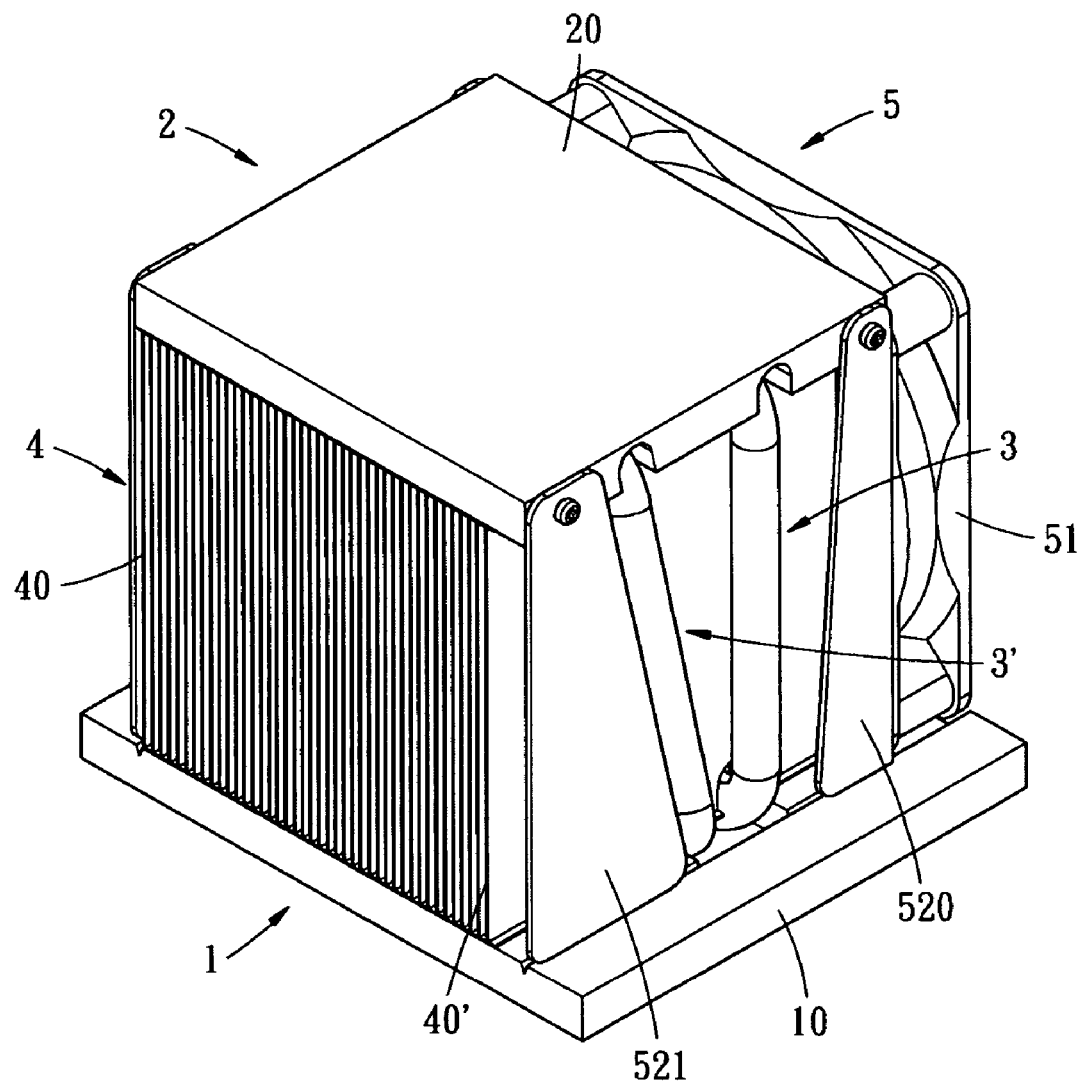
FIG. 6 shows a perspective view of the heat dissipating as shown in FIG. 5.
Figure 7:
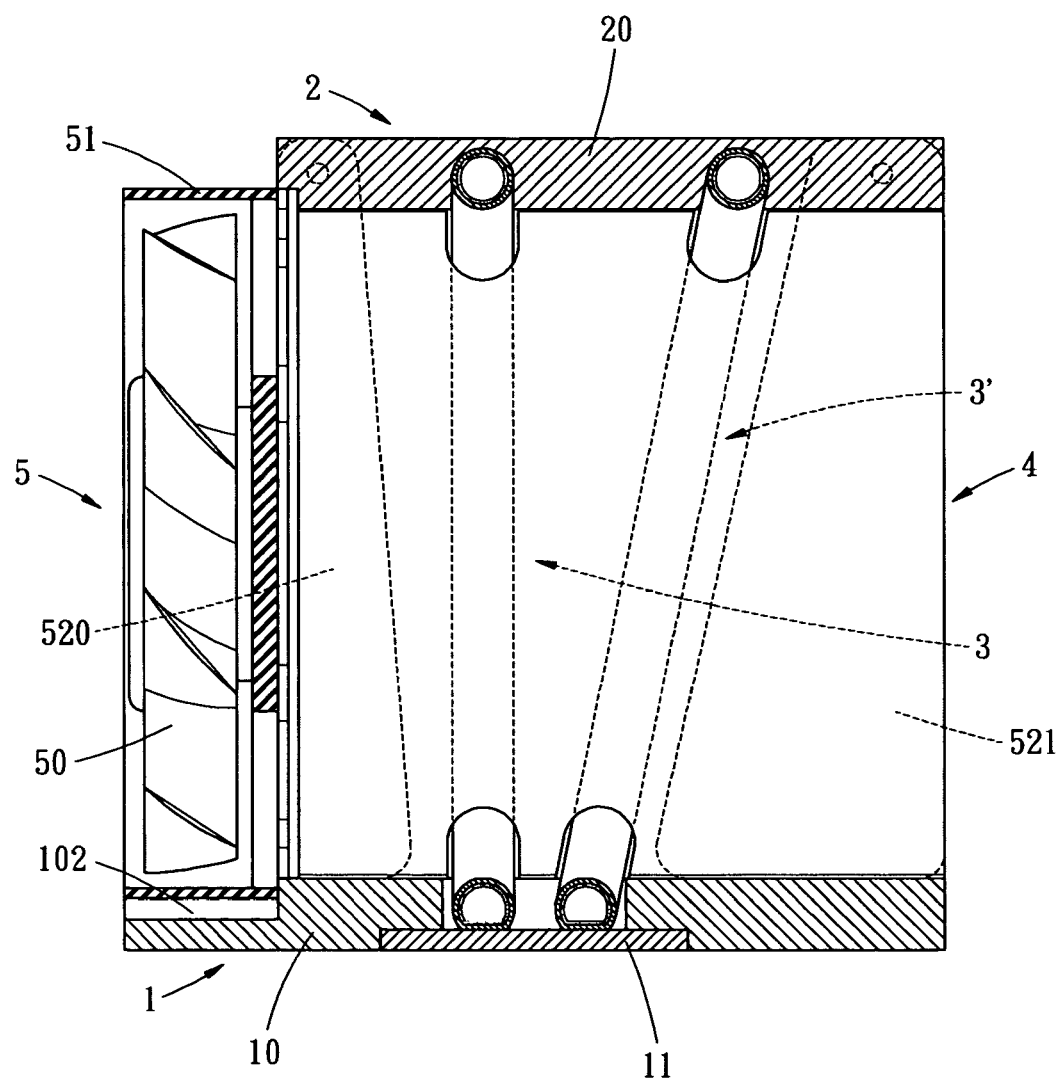
FIG. 7 shows a cross-sectional view of the fan as shown in FIGS. 5 and 6.

As shown in FIGS. 5–7, the heat dissipating device may further comprises a wind generating device such as a fan 5. The fan 5 can be installed on the lateral sides of the fins 40, such that a plurality of air circulating channels can be formed between the fins 40 and 41. To secure the fan to the heat dissipating device, the first heat sink 1 may further comprises a slot 102 allowing the bottom edge of the fan to be inserted therein (as shown in FIG. 7). This avoids the external frame 51 to increase the height of the blades 50 of the fan; and thus prevented heat accumulation by improper installation of the fan 5.

In addition, a wind mask 52 can also be formed. The wind mask 52 includes four sheets 520 and 521 attached to the outermost fins 40 and 40', such that the wind generated by the fan 5 can be concentrated to perform heat dissipation more effectively.

Accordingly, the present invention includes at least the following advantages.

1. The heat absorbing portions 30 and 30' are concentrated to be in contact with the heat generating source, such that heat can be effective absorbed and transferred to the heat dissipating portions 31 and 31' via the heat conductive portions 32 and 32'.

2. As mentioned above, as the heat dissipating portions 31 and 31' are remotely scattered on the second heat sink 2, a uniform temperature can be obtained by dissipating heat over a large area.

According to the above, the present invention uses the concept of driven array antenna to generate half-wave antenna members spaced from each other by slots to increase bandwidth of frequency domain. The simple structure successfully establishes an omni-directional radiation field with improved bandwidth. This disclosure provides exemplary embodiments of the present invention. The scope of this disclosure is not limited by these exemplary embodiments. Numerous variations, whether explicitly provided for by the specification or implied by the specification, such as variations in shape, structure, dimension, type of material or manufacturing process may be implemented by one of skill in the art in view of this disclosure.

What is claimed is:

1. A heat dissipating device with uniform heat points, comprising:
    a first heat sink;
    a second heat sink aligned over the first heat sink;
    at least two heat pipes, each heat pipe comprising a heat absorbing portion in thermal communication with the first sink and a heat dissipating portion in thermal communication with the second sink, wherein a distance between the heat absorbing portions of the heat pipes is smaller than a distance between the heat dissipating portions of the heat pipes; and
    a plurality of parallel arranged fins between the first and second heat sinks, wherein the fins extend perpendicularly to the first and second heat sinks.

2. The device of claim 1, wherein the first heat sink includes a substrate, which has a top surface opened with a slot for embedding the heat absorbing portion of the heat pipes therein.

3. The device of claim 1, wherein the first heat sink includes a substrate which has a bottom surface recessed with a receiving slot for embedding a thermal conductor having a thermal conductive coefficient larger than that of the first heat sink.

4. The device of claim 3, wherein the thermal conductor is fabricated from copper.

5. The device of claim 3, wherein the substrate of the first heat sink includes a bottom surface opened with a slot aligned over the receiving slots for embedding the heat absorbing portions of the heat pipes therein, such that the heat absorbing portions of the heat pipes are in direct contact with the thermal conductor.

6. The device of claim 1, wherein the second heat sink includes a substrate having a bottom surface opened with at least two slots for embedding the heat dissipating portions of the heat pipes therein.

7. The device according to claim 1, wherein each of the heat pipes includes a pair of bending portions and a plurality of the fins close to the bending portions each is recessed with two pairs notches allowing the being portions to be inserted therein.

8. The device according to claim 1, wherein each of the heat pipe includes a U-shape tube.

9. The device of claim 1, wherein each heat pipe further comprises a heat conducting portion interconnecting the heat absorbing and dissipating portions.

10. The device of claim 11, wherein each heat pipe further comprises a pair of bending portions between the heat absorbing portion and the heat conducting portion and the heat dissipating portion and the heat conducting portion.

11. The device of claim 1, one of the heat pipe is disposed along a vertical direction, while the other heat pipe is slanted by an angle with the vertical direction, such that the heat dissipating portions of the heat pipes are remote from each other, while the heat absorbing portions of the heat pipes are adjacent to each other.

12. The device of claim 1, further comprising a wind generating device disposed across the first and second heat sink.

13. The device of claim 12, wherein the wind generating device includes a fan.

14. The device of claim 12, wherein one edge of the first heat sink includes a recess allowing a bottom edge of the fan to be inserted therein.

15. The device of claim 12, further comprising a wind mask which comprises four sheets mounted across the first and the second heat sinks.

* * * * *